United States Patent
Komatsu et al.

(10) Patent No.: US 7,218,903 B2
(45) Date of Patent: May 15, 2007

(54) SQUELCH DETECTING CIRCUIT

(75) Inventors: Danichi Komatsu, Tokyo (JP);
Shintaro Mori, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 322 days.

(21) Appl. No.: 10/935,288

(22) Filed: Sep. 8, 2004

(65) Prior Publication Data

US 2005/0054311 A1    Mar. 10, 2005

(30) Foreign Application Priority Data

Sep. 10, 2003    (JP)    ............... 2003-318272

(51) Int. Cl.
*H04B 1/00*    (2006.01)
(52) U.S. Cl. .............. 455/218; 455/296; 375/351
(58) Field of Classification Search ........ 455/218–221, 455/230–231, 232.1, 234.1, 234.2, 296, 226.1, 455/226.2; 327/551; 375/346, 351
See application file for complete search history.

(56) References Cited

U.S. PATENT DOCUMENTS 4,991,227 A * 2/1991 Kehler, Jr. ................. 455/221

6,707,314 B2 * 3/2004 Kasahara et al. ............. 326/38
6,859,645 B2 * 2/2005 Yu .............................. 455/222

FOREIGN PATENT DOCUMENTS

JP    2002-344540 A    11/2002
JP    2002-344541 A    11/2002

* cited by examiner

*Primary Examiner*—Nguyen T. Vo
(74) *Attorney, Agent, or Firm*—McDermott Will & Emery LLP

(57) ABSTRACT

The present invention provides a squelch detecting circuit capable of high-speed transfer while using a reduced number of high-speed operating operational amplifiers to reduce power consumption and the cost of parts. Input differential signals inputted to a differential amplification circuit are amplified and the amplified signal is outputted to a gain proportion circuit. The gain proportion circuit supplies a potential holding circuit with a potential proportional to the amplified signal. The potential holding circuit holds the potential supplied from the gain proportion circuit. A comparator circuit compares the potential held by the potential holding circuit with a reference potential to decide whether it is a squelch state or a non-squelch state and outputs the result as a detect signal.

9 Claims, 12 Drawing Sheets

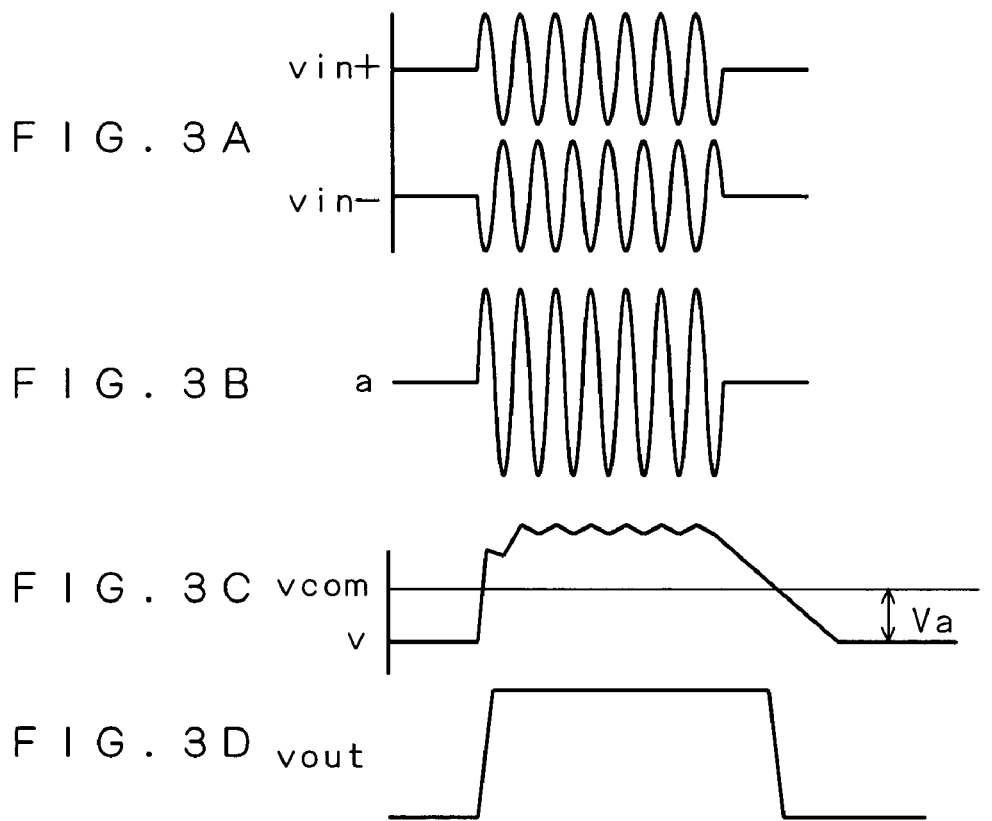
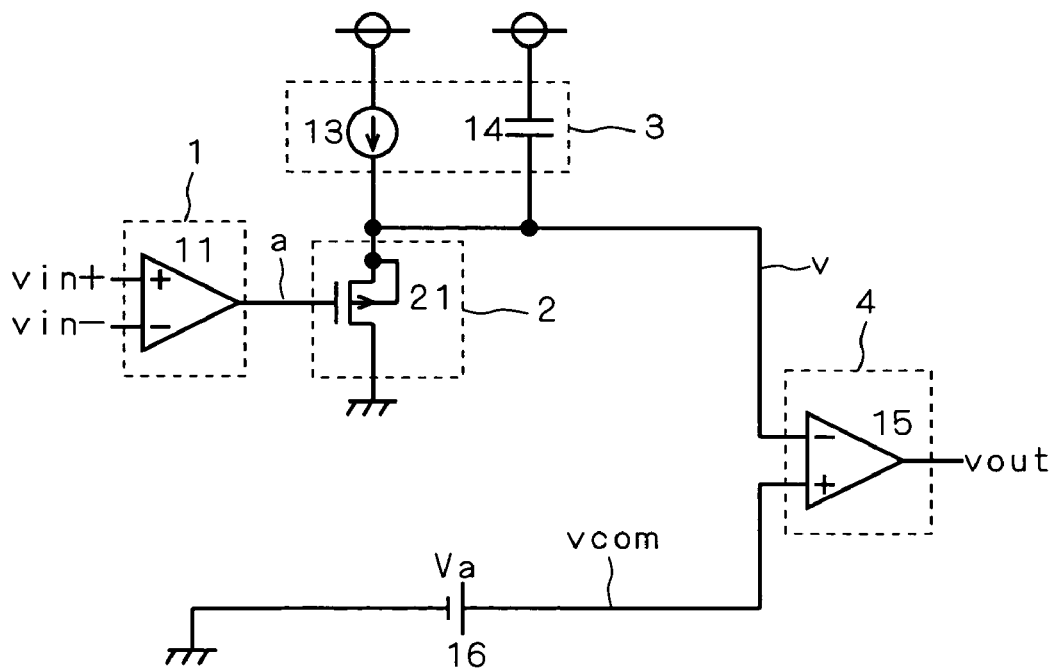

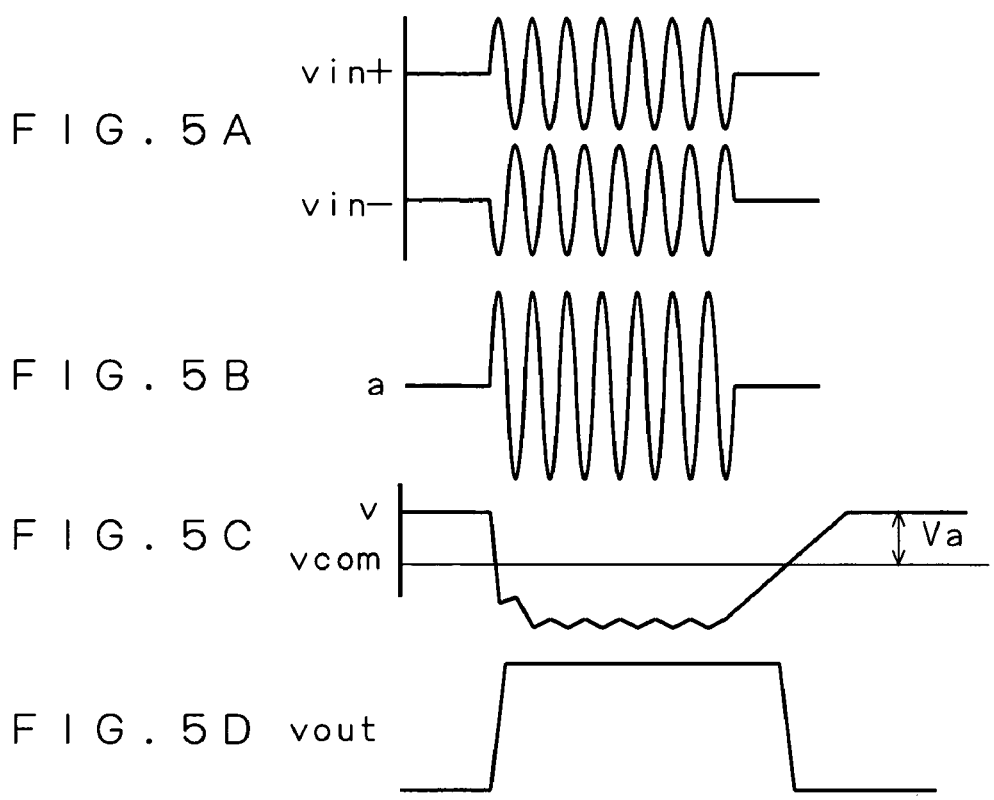
F I G. 5A
F I G. 5B
F I G. 5C
F I G. 5D
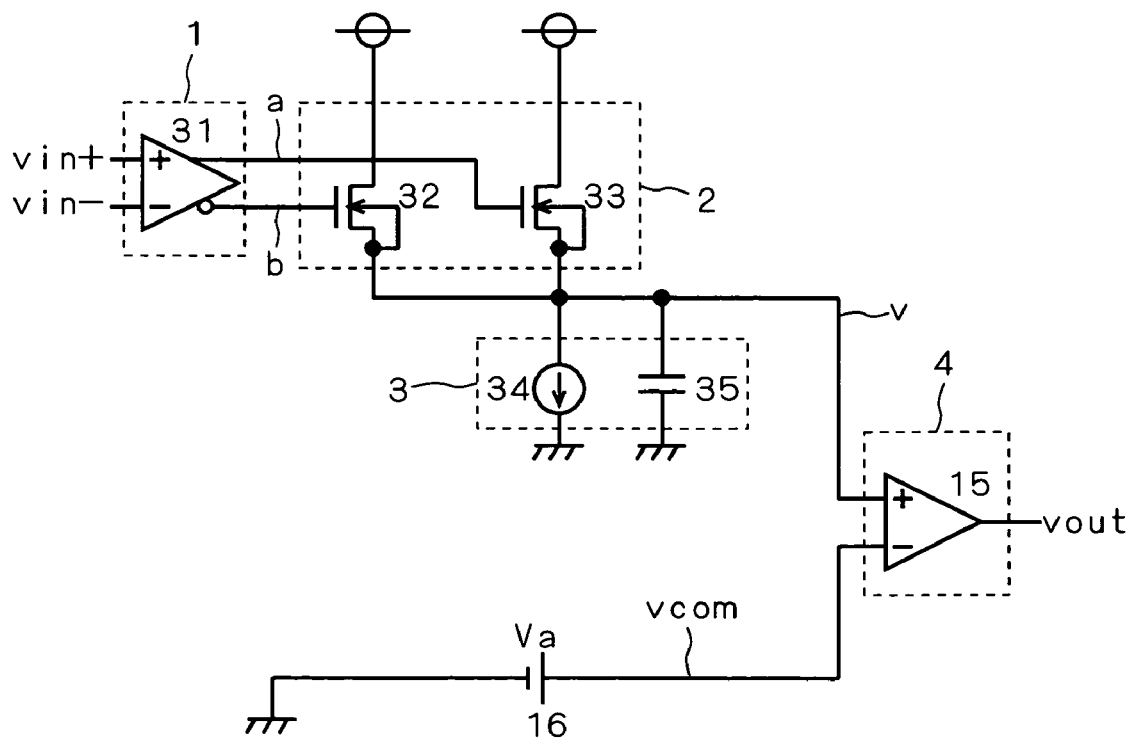
F I G. 6

FIG. 7C
FIG. 7D
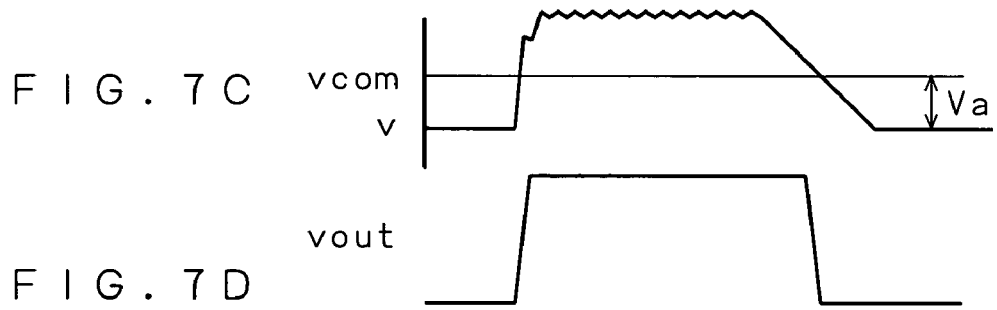
FIG. 8
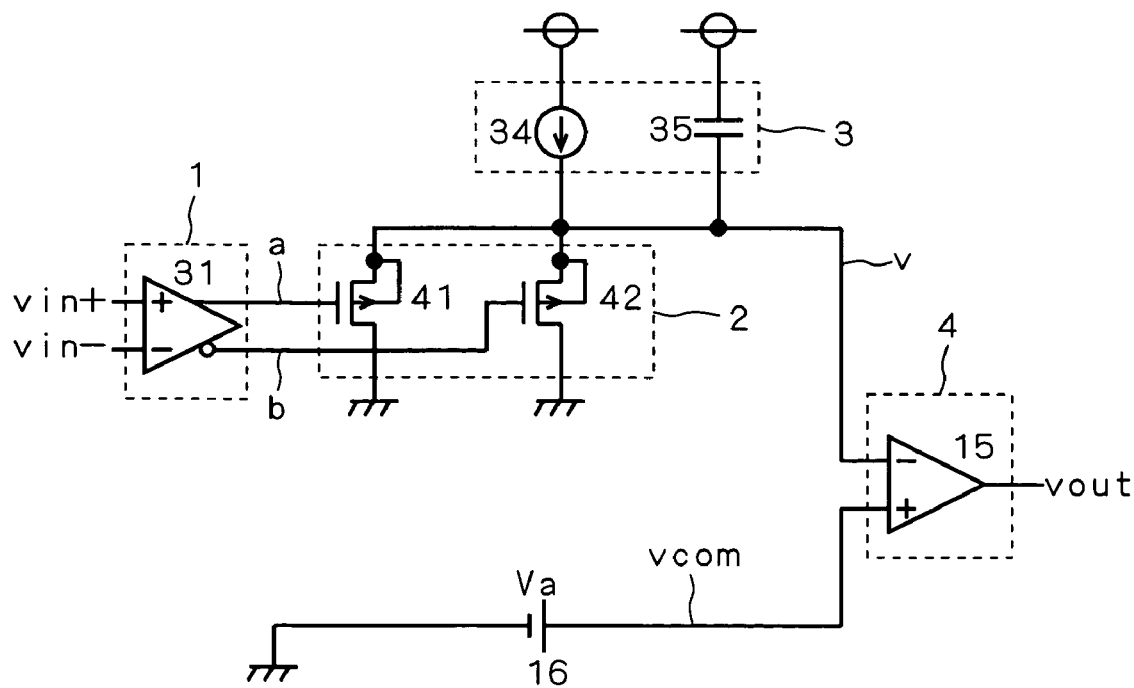

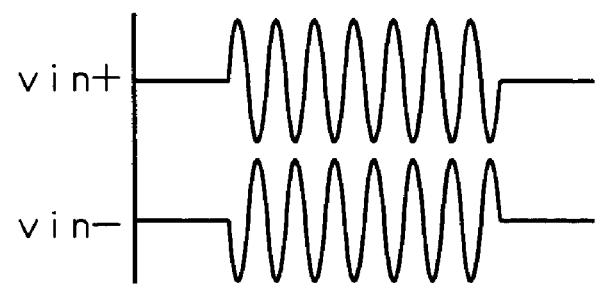
F I G. 1 1 A
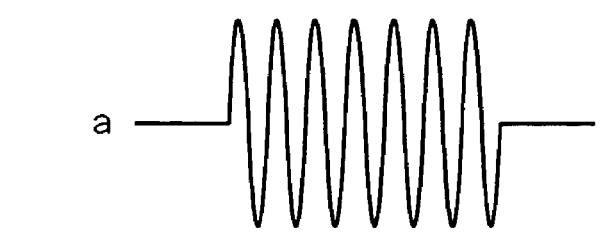
F I G. 1 1 B
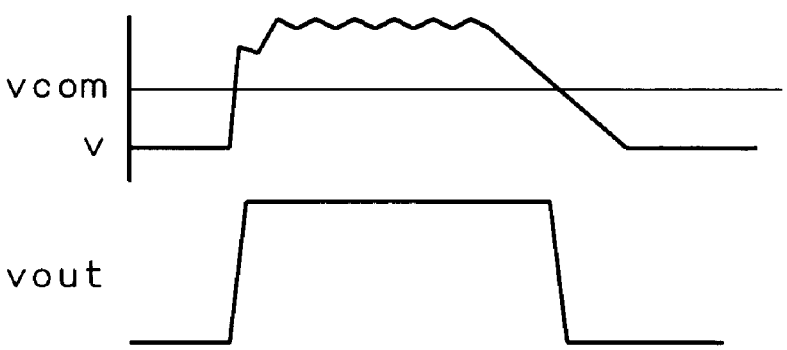
F I G. 1 1 C
F I G. 1 1 D F I G. 1 3 A 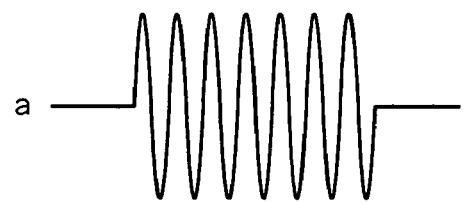
F I G. 1 3 B 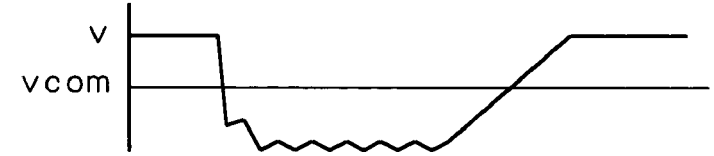
F I G. 1 3 C vout 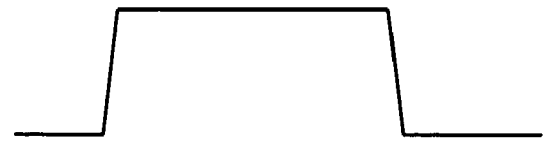
F I G. 1 4
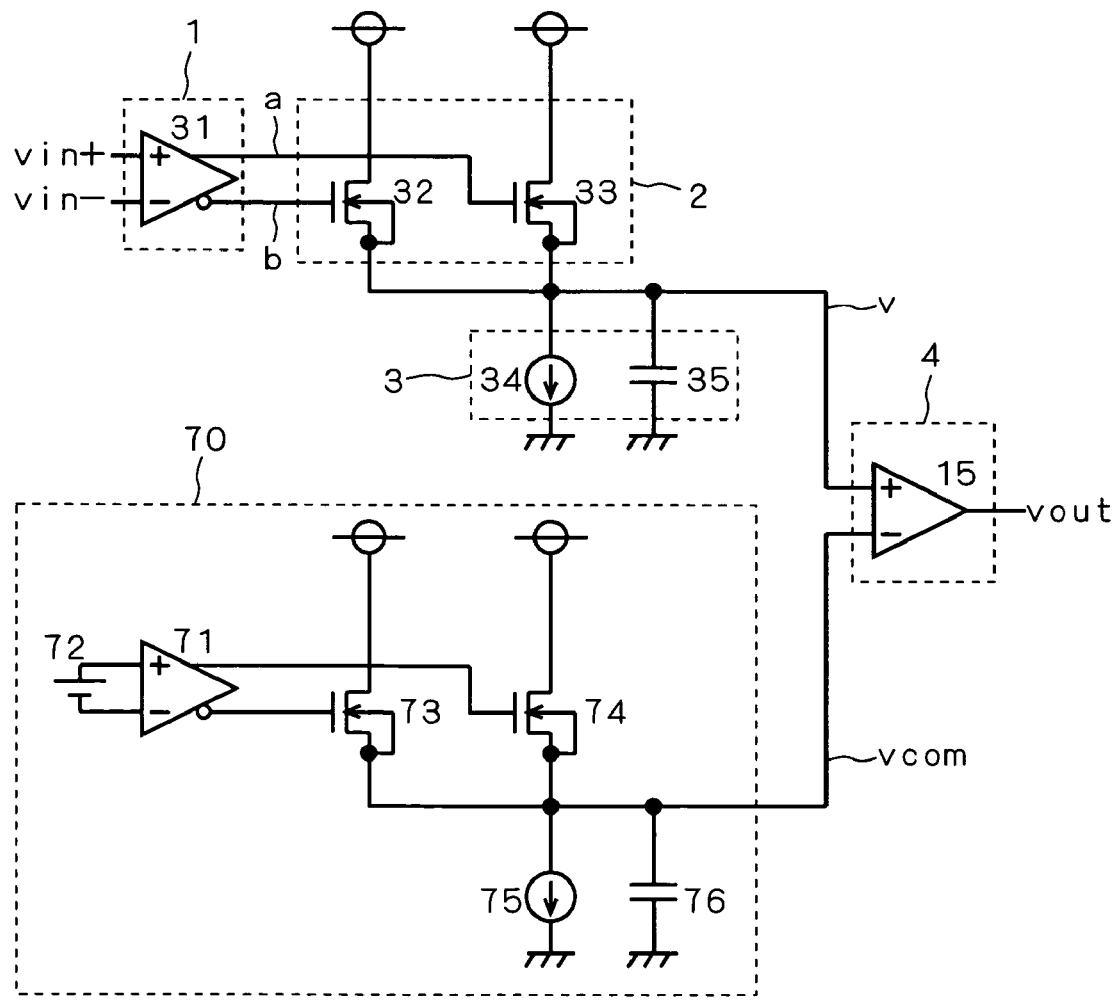

FIG. 15A a,b
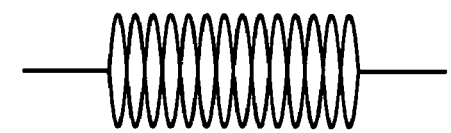
FIG. 15B vcom v
FIG. 15C vout
FIG. 16
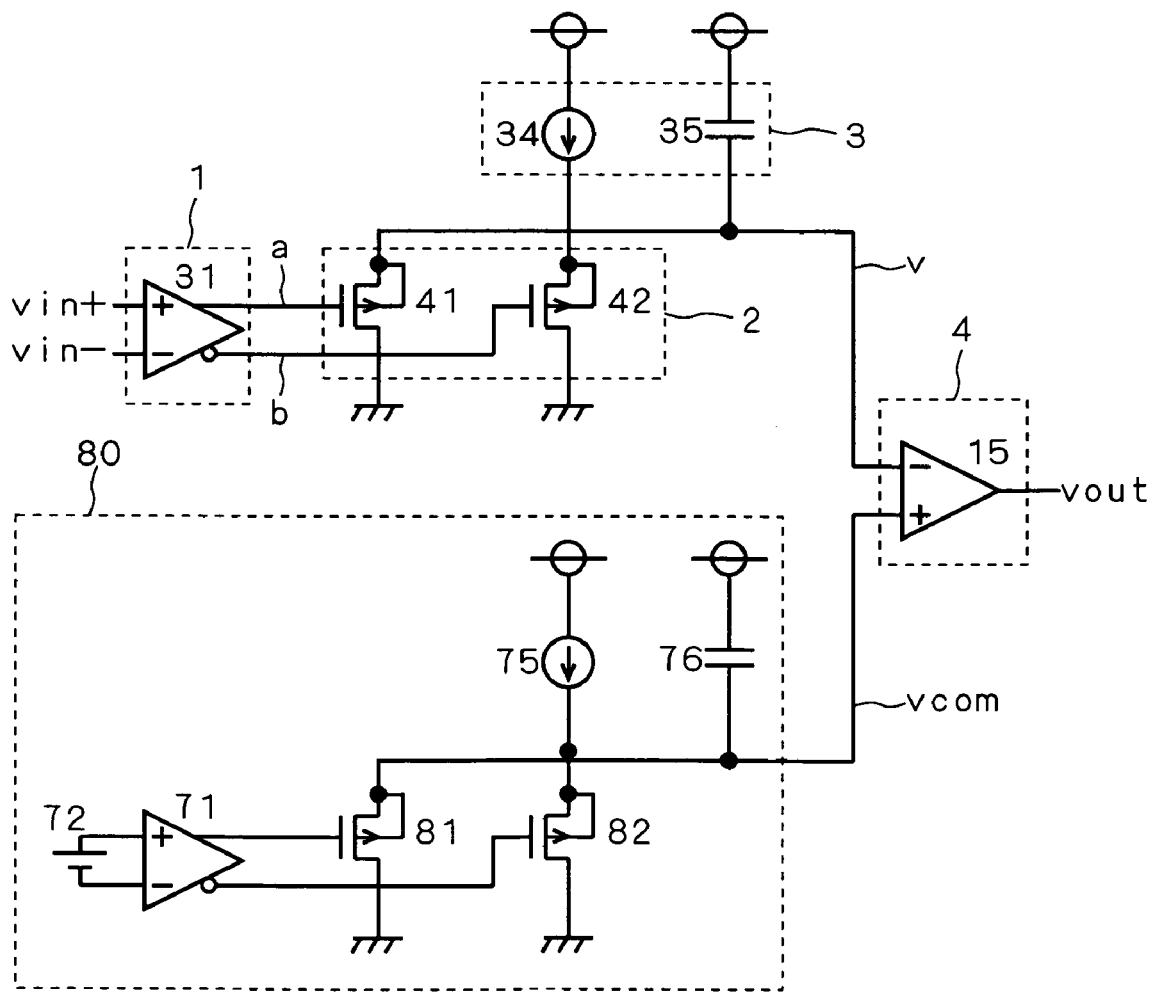

FIG. 17A a,b 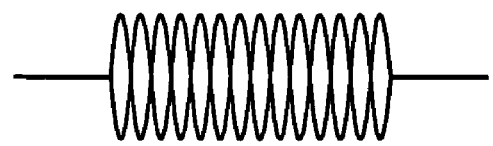
FIG. 17B vcom 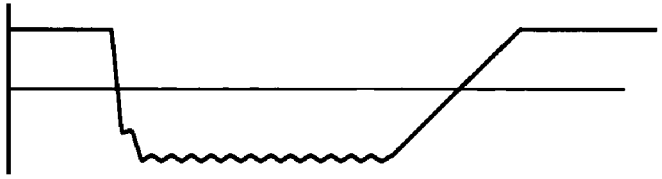
FIG. 17C vout 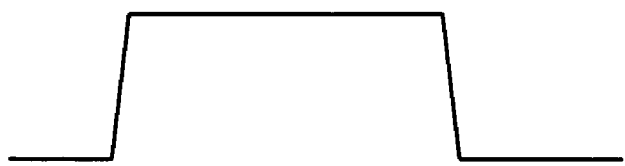

SQUELCH DETECTING CIRCUIT

BACKGROUND OF THE INVENTION

1. Field of the Invention

The present invention relates to squelch detecting circuits, and particularly to a squelch detecting circuit used in a serial interface.

2. Description of the Background Art

Recently, interfaces used to send/receive digital data are in progress toward higher speed, smaller amplitude, more differentiation, and more serialization. Factors causing these trends include the need to process larger amounts of digital data. Sending/receiving larger amounts of digital data (e.g. images or motion pictures) without delay requires higher-speed interfaces. Increased speed can be achieved by raising the transfer clock speed, but it has physical limitations. Another way to achieve increased speed is to reduce amplitudes of sent/received signals. Reducing signal amplitudes increases through rates at rises and falls of signals and thus speeds up signal sending/receiving.

However, reducing signal amplitudes reduces noise tolerance. To avoid this problem, signals are differentiated to increase the noise tolerance. Also, serializing interfaces offers cross-talk resistance and enables lower-cost production. From these viewpoints, recent personal computers, peripheral devices, etc. adopt the USB2.0, for example. Also, SerialATA standard is now in progress to provide interfaces faster than USB2.0.

Such serial interfaces are provided with squelch detecting circuits for detecting whether signals contain data or not. Such squelch detecting circuits are often used to generate a kind of pattern according to data presence/absence time intervals and establish a pre-communication prior to data transmission and reception. Also, the squelch detecting circuits are circuits for detecting signal squelch (no-signal) condition. The squelch condition is defined as a condition in which input differential signals Vin+ and Vin− are at the same potential. However, in reality, it is difficult to cause the input differential signals Vin+ and Vin− to be perfectly at the same potential, but potential differences occur to some degree. For example, the SerialATA standard provides that a reference value for distinguishing squelch and non-squelch should be set between 50 mV and 200 mV in terms of the amplitude after converted to single-end. When the reference value is set at 100 mV, a signal amplitude of 50 mV after the single-end conversion is judged to be a squelch state and a signal amplitude of 150 mV after the single-end conversion is judged to be a non-squelch state (signal level).

Next, a conventional squelch detecting circuit is described. First, the squelch detecting circuit includes an operational amplifier that receives input differential signals and an operational amplifier that receives a voltage based on a squelch state judging reference. The plus outputs of these operational amplifiers are connected to each other and their minus outputs are connected to each other, too. Therefore the output differential signal exhibits a waveform in which an offset value is added on one side. When the individual operational amplifiers have a gain of one, the offset value is a voltage value based on the squelch state judging reference.

The differential signal with the offset value added on one side is amplified through plural stages of operational amplifiers to obtain a final signal. The differential signal with offset value added on one side includes a plus-side signal and a minus-side signal. When the plus-side signal and the minus-side signal have an amplitude larger than the offset value, then the signals are superimposed on each other to finally provide an output signal corresponding to the data. When the plus-side signal and the minus-side signal have an amplitude smaller than the offset value, then the signals are not superimposed and finally provide an output signal fixed at a low level. The conventional squelch detecting circuit thus operates to detect a squelch state and a non-squelch state.

The operation of the squelch detecting circuit is similar to that of a signal receiver circuit. However, the squelch detecting circuit which adds an offset value to detect a squelch state and a non-squelch state differs from the receiver circuit that requires no offset value. If a squelch detecting circuit is provided with a function as a receiver circuit, then the addition of the offset value affects the duty ratio of the finally obtained data. Therefore a receiver circuit is provided separately from the squelch detecting circuit.

Next, Japanese Patent Application Laid-Open Nos. 2002-344540 (pp. 8–19, FIGS. 1–14: this reference is hereinafter referred to as First Patent Document) and 2002-344541 (pp. 7–16, FIGS. 1–10: this reference is hereinafter referred to as Second Patent Document) describe improvements of conventional squelch detecting circuits. In the squelch detecting circuits described in First and Second Patent Documents, a peak hold circuit holds a peak value of an input signal at a given node. Then, while the potential at the given node varies as the peak hold circuit holds the peak value, a constant-potential setting circuit constantly brings it back to a given potential with a time constant larger than the potential variation caused by the holding of the peak value. Then a comparator circuit compares with a given reference level the potential at the node that is held at the peak value and slowly brought back to the given potential and outputs the result of the comparison as a detect signal.

However, in order to obtain a final output signal from input differential signals, conventional squelch detecting circuits are required to provide amplifying performance equivalent to or higher than that of receiver circuits. Therefore conventional squelch detecting circuits require plural stages of operational amplifiers and consume huge power. In fact, the USB2.0 (with a transfer rate of 480 Mbps) requires six to seven stages of operational amplifiers. Also, high transfer rates, like that of USB2.0, require operational amplifiers to operate at high speed, leading to increased cost of parts.

Moreover, when a plurality of operational amplifiers are provided, the amplification factors of individual operational amplifiers vary due to electrical characteristic differences among them, temperature variations during operation, and supplied voltage variations. The variations of individual operational amplifiers make it difficult for the conventional squelch detecting circuits to operate steadily.

The squelch detecting circuits described in First and Second Patent Documents cited above use peak hold circuits and therefore, unlike other conventional squelch detecting circuits, they do not need plural stages of operational amplifiers. Thus the squelch detecting circuits described in First and Second Patent Documents can solve the above-described problems. However, since the circuit configurations of the squelch detecting circuits described in First and Second Patent Documents include feedback portions, the held peak values are limited. A squelch detecting circuit with limited peak value can operate up to the transfer rate of 480 Mbps of USB2.0, but, with SerialATA with a transfer rate of 1.5 Gbps, such a squelch detecting circuit with limited peak value may be unable to obtain sufficient gain and unable to operate.

SUMMARY OF THE INVENTION

An object of the present invention is to provide a squelch detecting circuit capable of high-speed transfer while using a reduced number of high-speed operating operational amplifiers to reduce power consumption and the cost of parts.

A squelch detecting circuit includes a differential amplification circuit, a gain proportion circuit, a potential holding circuit, and a comparator circuit.

The differential amplification circuit amplifies differential input signals to output an amplified signal and the gain proportion circuit supplies a potential proportional to the amplified signal. The potential holding circuit holds the potential supplied from the gain proportion circuit and the comparator circuit compares the potential held by the potential holding circuit and a reference potential to output a detect signal.

The squelch detecting circuit of the present invention thus includes the differential amplification circuit that amplifies differential input signals to output an amplified signal, the gain proportion circuit that supplies a potential proportional to the amplified signal, the potential holding circuit that holds the potential supplied from the gain proportion circuit, and the comparator circuit that compares the potential held by the potential holding circuit and a reference potential to output a detect signal, which configuration requires a reduced number of high-speed operating operational amplifiers and reduces power consumption.

Also, according to the squelch detecting circuit of the invention, reducing the number of high-cost high-speed operational amplifiers reduces the cost of parts. Furthermore, the squelch detecting circuit of the invention involves a reduced number of amplifications by operational amplifiers and offers insusceptibility to temperature variations and electrical characteristic variations, thus enabling steady operation. Also, the squelch detecting circuit of the invention is not restricted by the input differential signals since it obtains potential proportional to the input differential signals.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3A to 3D are diagrams showing the waveforms of signals in the squelch detecting circuit of the first preferred embodiment of the invention;

FIG. 4 is a circuit diagram of a squelch detecting circuit according to a modification of the first preferred embodiment of the invention;

FIGS. 5A to 5D are diagrams showing the waveforms of signals in the squelch detecting circuit of the modification of the first preferred embodiment of the invention;

FIG. 6 is a circuit diagram of a squelch detecting circuit according to a second preferred embodiment of the invention;

FIGS. 7A to 7D are diagrams showing the waveforms of signals in the. squelch detecting circuit of the second preferred embodiment of the invention;

FIG. 8 is a circuit diagram of a squelch detecting circuit according to a modification of the second preferred embodiment of the invention;

FIGS. 11A to 11D are diagrams showing the waveforms of signals in the squelch detecting circuit of the third preferred embodiment of the invention;

FIGS. 13A to 13C are diagrams showing the waveforms of signals in the squelch detecting circuit of the modification of the third preferred embodiment of the invention;

FIG. 14 is a circuit diagram of a squelch detecting circuit according to a modification of the third preferred embodiment of the invention;

FIGS. 15A to 15C are diagrams showing the waveforms of signals in the squelch detecting circuit of the modification of the third preferred embodiment of the invention;

FIG. 16 is a circuit diagram of a squelch detecting circuit according to a modification of the third preferred embodiment of the invention; and FIGS. 17A to 17C are diagrams showing the waveforms of signals in the squelch detecting circuit of the modification of the third preferred embodiment of the invention.

DESCRIPTION OF THE PREFERRED EMBODIMENTS

Figure 1:
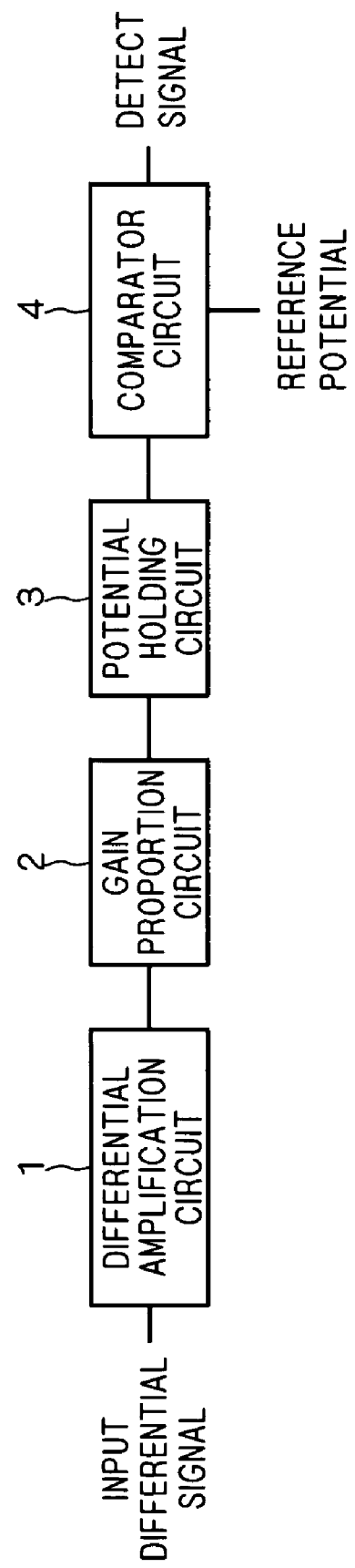
FIG. 1 is a block diagram illustrating a squelch detecting circuit according to a first preferred embodiment of the present invention.

The present invention is now specifically described referring to the drawings showing the preferred embodiments.

(First Preferred Embodiment)

FIG. 1 is a block diagram of a squelch detecting circuit according to this preferred embodiment. In FIG. 1, input differential signals inputted to a differential amplification circuit 1 are amplified and the amplified signal is outputted to a gain proportion circuit 2. The gain proportion circuit 2 supplies to a potential holding circuit 3 a potential proportional to the amplified signal. The potential holding circuit 3 holds the potential supplied from the gain proportion circuit 2. A comparator circuit 4 compares the potential held by the potential holding circuit 3 with a reference potential to decide whether it is a squelch state or a non-squelch state and outputs the result as a detect signal.

Figure 2:
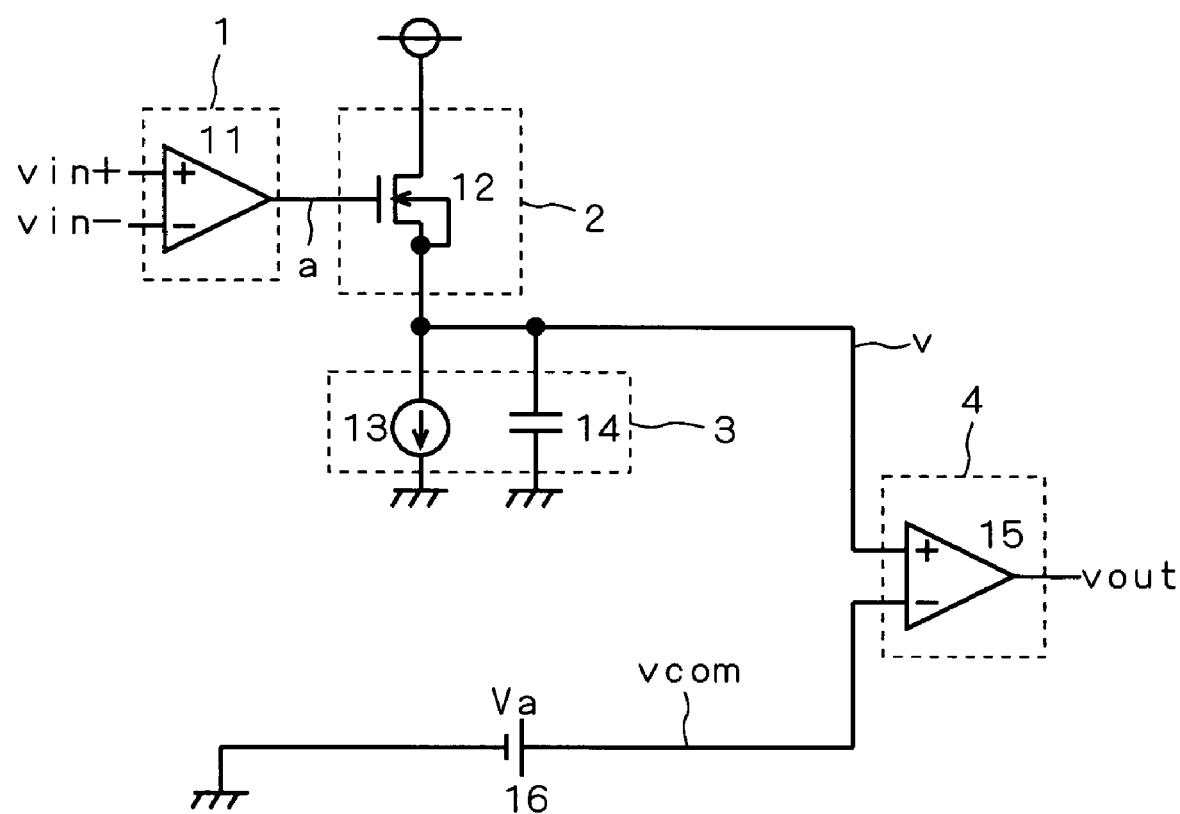
FIG. 2 is a circuit diagram of the squelch detecting circuit of the first preferred embodiment of the invention.

FIG. 2 is a circuit diagram of the squelch detecting circuit of this preferred embodiment. In FIG. 2, the differential amplification circuit 1 includes an operational amplifier 11, where the operational amplifier 11 amplifies input differential signals to output a single-end amplified signal. The gain proportion circuit 2 includes an n-channel transistor 12, where the amplified signal is applied to the gate electrode of the n-channel transistor 12 and a potential proportional to the amplified signal is supplied to the potential holding circuit 3. In the present invention, the n-channel transistor 12 is shown as an example and a bipolar transistor may be used instead.

The potential holding circuit 3 includes a current source 13 and a capacitance 14, where the current source 13 and the capacitance 14 each have one terminal connected to the source electrode of the n-channel transistor 12 and the other terminal connected to GND. The comparator circuit 4 includes an operational amplifier 15, where the potential from the potential holding circuit 3 is supplied to the plus terminal of the operational amplifier 15 and a potential from a constant-voltage source 16, or the reference potential, is supplied to its minus terminal.

Next, the operation of the squelch detecting circuit of this preferred embodiment is described. FIG. 3A shows the input differential signals vin+ and vin− inputted to the operational amplifier 1. The input differential signals vin+ and vin− are converted by the operational amplifier 11 to the single-end amplified signal, a, and outputted as a waveform as shown in FIG. 3B. This amplified signal, a, is inputted to the gate electrode of the n-channel transistor 12 and then the n-channel transistor 12 operates to supply the potential holding circuit 3 with a potential proportional to the amplified signal a. The potential of the source electrode of the n-channel transistor 12, v, sharply rises as the amplified signal a rises. However, when the amplified signal a falls, since the charge has to be released through the current source 13, the potential v of the source electrode of the n-channel transistor 12 falls at a certain rate, lagging behind the amplified signal a.

Also, since the potential holding circuit 3 includes the capacitance 14, the. source electrode voltage v of the transistor 12 is held for a certain period. FIG. 3C shows the output potential v provided from the potential holding circuit 3 upon the input of the amplified signal a. In FIG. 3C, as the amplified signal a rises, the potential v of the source electrode of the n-channel transistor 12 sharply rises and it is then held. In FIG. 3C, in the leading portion of the waveform, the potential is unable to follow the rise of the amplified signal a, and thus the potential does not sufficiently rise and is therefore lower than in the remaining portion. Also, in FIG. 3C, the potential v keeps the peak value even when the amplified signal a falls, which is caused by the function of the potential holding circuit 3. The charge held in the capacitance 14 can be only gradually released through the current source 13, so that the potential decreases at a certain rate in the waveform.

The potential v held by the potential holding circuit 3 is inputted to the plus side of the operational amplifier 15. In a conventional squelch detecting circuit, a VCM potential, or a middle-point potential of the input differential signals, with a certain offset added thereto, will be inputted to the minus side of the operational amplifier 15. However, in this preferred embodiment, since the potential inputted to the plus side of the operational amplifier 15 is a relative value proportional to the input differential signals and the absolute value is unknown, the VCM potential cannot be applied to the minus side of the operational amplifier 15. Therefore, in this preferred embodiment, a comparison potential obtained by circuit simulation is inputted to the minus side of the operational amplifier 15. In FIG. 2, the constant-voltage source 16 generates the comparison potential obtained by circuit simulation. FIG. 3C also shows the waveform of the potential vcom of the constant-voltage source 16. The potential vcom is a fixed potential that differs by the voltage Va of the constant-voltage source 16 from the reference potential of the potential v held by the potential holding circuit 3.

The operational amplifier 15 compares the potential v held by the potential holding circuit 3 with the potential vcom of the constant-voltage source 16. Referring to FIG. 3C, the operational amplifier 15 indicates a High state when the potential v held by the potential holding circuit 3 is larger than the potential vcom and indicates a Low state when it is smaller than the potential vcom. Then the operational amplifier 15 outputs a rectangular-wave detect signal vout as shown in FIG. 3D.

As described so far, in the squelch detecting circuit of this preferred embodiment, the differential amplification circuit 1 is formed of the operational amplifier 11 that amplifies the differential input signals to output a single-end amplified signal, the gain proportion circuit 2 is formed of the n-channel transistor 12 that receives the single-end amplified signal at its gate electrode and supplies a potential from its source electrode to the potential holding circuit 3, the potential holding circuit 3 is formed of the current source 13 having its one terminal connected to the source electrode of the n-channel transistor 12 and the other terminal connected to GND and the capacitance 14 having its one terminal connected to the source electrode of the n-channel transistor 12 and to the current source 13 and having the other terminal connected to GND, and the comparator circuit 4 is formed of the operational amplifier 15 that receives the potential held by the potential holding circuit 3 and the reference potential, which configuration reduces the number of high-speed operating operational amplifiers and reduces power consumption. Furthermore, reducing the number of high-cost high-speed operational amplifiers reduces the cost of parts. Moreover, reducing the number of amplifications by operational amplifiers offers insusceptibility to temperature variations and electrical characteristic variations, thus enabling steady operation. Also, unlike conventional squelch detecting circuits, the squelch detecting circuit of the preferred embodiment is not restricted by the input differential signals since it obtains potential proportional to the input differential signals.

While the operational amplifier 11 is required to operate at high speed, the operational amplifier 15, which compares the potential held by the potential holding circuit 3 and the potential Va of the constant-voltage source 16, is not required to operate at high speed. Thus the squelch detecting circuit of this preferred embodiment needs only a single high-speed operating operational amplifier.

<Modification>

FIG. 4 is a circuit diagram illustrating a modification of the squelch detecting circuit of this preferred embodiment. In FIG. 4, too, the differential amplification circuit 1 includes the operational amplifier 11, where the operational amplifier 11 amplifies input differential signals to output a single-end amplified signal. The gain proportion circuit 2 includes a p-channel transistor 21, where the amplified signal is applied to the gate electrode of the p-channel transistor 21 and a potential proportional to the amplified signal is supplied to the potential holding circuit 3. The squelch detecting circuit of this modification differs from that of the preferred embodiment in that it uses the p-channel transistor 21 in place of the n-channel transistor 12. In the present invention, the p-channel transistor 21 is shown as an example and a bipolar transistor may be used instead.

The potential holding circuit 3 includes the current source 13 and the capacitance 14, where the current source 13 and the capacitance 14 each have one terminal connected to the source electrode of the p-channel transistor 21 and the other terminal connected to power-supply. The comparator circuit 4 includes the operational amplifier 15, where the potential from the potential holding circuit 3 is supplied to the minus terminal of the operational amplifier 15 and the potential from the constant-voltage source 16, or the reference potential, is supplied to its plus terminal. As compared with the preferred embodiment, the inputs of the operational amplifier 15 are reversed because the p-channel transistor 21 is used in place of the n-channel transistor 12.

Next, the operation of the squelch detecting circuit of this modification is described. FIG. 5A shows the input differential signals vin+ and vin− inputted to the operational amplifier 11. The input differential signals vin+ and vin− are converted by the operational amplifier 11 to the single-end amplified signal, a, and outputted as a waveform as shown in FIG. 5B. This amplified signal a is inputted to the gate electrode of the p-channel transistor 21 and then the p-channel transistor 21 operates to supply the potential holding circuit 3 with a potential proportional to the amplified signal a. The potential, v, of the source electrode of the p-channel transistor 21 sharply falls as the amplified signal a falls. However, when the amplified signal a rises, since charge has to be supplied through the current source 13, and also because of the presence of the capacitance 14, the potential v of the source electrode of the p-channel transistor 21 is kept nearly constant. FIG. 5C shows the output potential v provided from the potential holding circuit 3 upon the input of the amplified signal a.

The potential v held by the potential holding circuit 3 is inputted to the minus side of the operational amplifier 15. On the other hand, a comparison potential obtained by circuit simulation is,inputted to the plus side of the operational amplifier 15. FIG. 5C also shows the waveform of the potential vcom of the constant-voltage source 16. The potential vcom is a fixed potential that differs by the voltage Va of the constant-voltage source 16 from the reference potential of the potential v held by the potential holding circuit 3.

The operational amplifier 15 compares the potential v held by the potential holding circuit 3 with the potential vcom of the constant-voltage source 16. Referring to FIG. 5C, the operational amplifier 15 indicates a High state when the potential v held by the potential holding circuit 3 is smaller than the potential vcom and indicates a Low state when it is larger than the potential vcom. Then the operational amplifier 15 outputs a rectangular-wave detect signal vout as shown in FIG. 5D.

As described so far, in the squelch detecting circuit of this modification, the differential amplification circuit 1 is formed of the operational amplifier 11 that amplifies differential input signals to output a single-end amplified signal, the gain proportion circuit 2 is formed of the p-channel transistor 21 that receives the single-end amplified signal at its gate electrode and supplies a potential from its source electrode to the potential holding circuit 3, the potential holding circuit 3 is formed of the current source 13 having its one terminal connected to the source electrode of the p-channel transistor 21 and the other terminal connected to the power-supply potential and the capacitance 14 having its one terminal connected to the source electrode of the p-channel transistor 21 and to the current source 13 and having the other terminal connected to the power-supply potential, and the comparator circuit 4 is formed of the operational amplifier 15 that receives the potential held by the potential holding circuit 3 and the reference potential, which configuration, as well as that of the preferred embodiment, reduces the number of high-speed operating operational amplifiers and reduces power consumption. Furthermore, reducing the number of high-cost high-speed operational amplifiers reduces the cost of parts. Moreover, reducing the number of amplifications by operational amplifiers offers insusceptibility to temperature variations and electrical characteristic variations, thus enabling steady operation. Also, unlike conventional squelch detecting circuits, the squelch detecting circuit of the modification is not restricted by the input differential signals since it obtains potential proportional to the input differential signals.

While the operational amplifier 11 is required to operate at high speed, the operational amplifier 15, which compares the potential held by the potential holding circuit 3 and the potential Va of the constant-voltage source 16, does not have to operate at high speed. Thus the squelch detecting circuit of this modification needs just a single high-speed operating operational amplifier.

(Second Preferred Embodiment)

The block diagram of FIG. 1 is applied also to the squelch detecting circuit of this preferred embodiment. FIG. 6 is a circuit diagram of the squelch detecting circuit of this preferred embodiment. In FIG. 6, the differential amplification circuit 1 includes an operational amplifier 31, where the operational amplifier 31 amplifies input differential signals to output differential amplified signals. The gain proportion circuit 2 includes an n-channel transistor 32 and an n-channel transistor 33, where one of the differential amplified signals that is outputted from the minus side of the operational amplifier 31 is applied to the gate electrode of the n-channel transistor 32. The other differential amplified signal outputted from the plus side of the operational amplifier 31 is applied to the gate electrode of the n-channel transistor 33. The n-channel transistor 32 and the n-channel transistor 33 supply the potential holding circuit 3 with potential proportional to the applied differential amplified signals. In the present invention, the n-channel transistors 32 and 33 are shown as an example and bipolar transistors may be used instead.

The potential holding circuit 3 includes a current source 34 and a capacitance 35, where the current source 34 and the capacitance 35 each have one terminal connected to the source electrodes of the n-channel transistor 32 and the n-channel transistor 33, and their other terminals are connected to GND. The comparator circuit 4 includes the operational amplifier 15, where the potential from the potential holding circuit 3 is supplied to the plus terminal of the operational amplifier 15 and the potential from the constant-voltage source 16, or the reference potential, is supplied to its minus terminal.

Figure 7A:
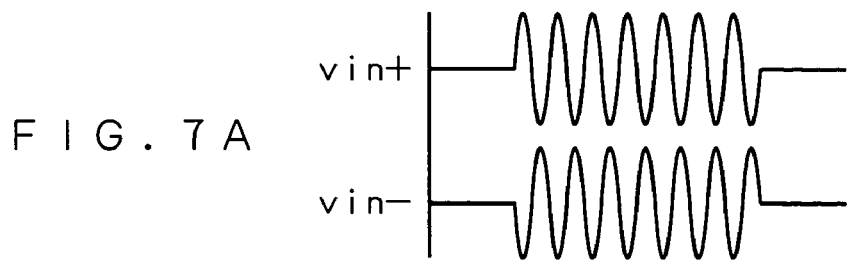
Figure 7B:
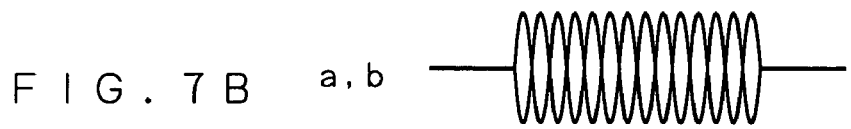

Next, the operation of the squelch detecting circuit of this preferred embodiment is described. FIG. 7A shows the input differential signals vin+ and vin− inputted to the operational amplifier 31. The input differential signals vin+ and vin− are amplified and converted by the operational amplifier 31 to differential amplified signals, a and b. FIG. 7B shows the waveform of the differential amplified signals a and b being superimposed. The differential amplified signals a and b are inputted to the gate electrodes of the n-channel transistor 32 and the n-channel transistor 33 and then the n-channel transistor 32 and the n-channel transistor 33 operate to supply the potential holding circuit 3 with potential proportional to the amplified signals a and b. The potential v of the source electrodes of the n-channel transistor 32 and the n-channel transistor 33 sharply rises as the amplified signals a and b rise. However, when the amplified signals a and b fall, since the charge is released through the current source 34, the potential v of the source electrodes of the n-channel transistor 32 and the n-channel transistor 33 falls at a certain rate, lagging behind the amplified signals a and b.

Also, since the potential holding circuit 3 includes the capacitance 35, the source electrode potential v of the transistor 32 and the n-channel transistor 33 is held for a certain period. FIG. 7C shows the output potential v provided from the potential holding circuit 3 upon the input of the amplified signals a and b. In FIG. 7C, as the amplified signals a and b rise, the potential v of the source electrodes of the n-channel transistor 32 and the n-channel transistor 33 sharply rises and it is then held. In this preferred embodiment, the potential of the source electrode of the transistor 32 and the potential of the source electrode of the n-channel transistor 33 are synthesized to form the output potential v of the potential holding circuit 3. Therefore, in this preferred embodiment, as compared with the first preferred embodiment, the potential peaks at which the source electrode potential is desirably to be held appear at almost half time intervals, providing a rectification effect. FIG. 7C shows this with the rectangular wave having a flatter top than that of FIG. 3C.

The potential v held by the potential holding circuit 3 is inputted to the plus side of the operational amplifier 15. On the other hand, as in the first preferred embodiment, a comparison potential obtained by circuit simulation is inputted to the minus side of the operational amplifier 15. In FIG. 6, the constant-voltage source 16 generates the comparison potential obtained by circuit simulation. FIG. 7C also shows the waveform of the potential vcom of the constant-voltage source 16. The potential vcom is a fixed potential that differs by the voltage Va of the constant-voltage source 16 from the reference potential of the potential v held by the potential holding circuit 3.

The operational amplifier 15 compares the potential v held by the potential holding circuit 3 with the output potential vcom of the constant-voltage source 16. Referring to FIG. 7C, the operational amplifier 15 indicates a High state when the potential v held by the potential holding circuit 3 is larger than the potential vcom and indicates a Low state when it is smaller than the potential vcom. Then the operational amplifier 15 outputs a rectangular-wave detect signal vout as shown in FIG. 7D.

As described so far, in the squelch detecting circuit of this preferred embodiment, the differential amplification circuit 1 is formed of the operational amplifier 31 that amplifies differential input signals to output differential amplified signals, the gain proportion circuit 2 is formed of the n-channel transistor 32 that receives one of the differential amplified signals at its gate electrode and supplies a potential from its source electrode to the potential holding circuit 3 and the n-channel transistor 33 that receives the other of the differential amplified signals at its gate electrode and supplies a potential from its source electrode to the potential holding circuit 3, the potential holding circuit 3 is formed of the current source 34 that has its one terminal connected to the source electrodes of the n-channel transistors 32 and 33 and the other terminal connected to GND and the capacitance 35 having its one terminal connected to the source electrodes of the n-channel transistors 32 and 33 and to the current source 34 and having the other terminal connected to GND, and the comparator circuit 4 is formed of the operational amplifier 15 that receives the potential held by the potential holding circuit 3 and the reference potential, so that the potential outputted from the potential holding circuit 3 exhibits an almost flat rectangular waveform by a rectification effect, which enables steadier operation of the squelch detecting circuit.

While the operational amplifier 31 is required to operate at high speed, the operational amplifier 15, which compares the potential held by the potential holding circuit 3 and the potential Va of the constant-voltage source 16, does not have to operate at high speed. Thus the squelch detecting circuit of this preferred embodiment needs just one high-speed operating operational amplifier.

(Modification)

FIG. 8 is a circuit diagram illustrating a modification of the squelch detecting circuit of this preferred embodiment. In FIG. 8, too, the differential amplification circuit 1 includes the operational amplifier 31, where the operational amplifier 31 amplifies the input differential signals to output differential amplified signals. The gain proportion circuit 2 includes a p-channel transistor 41 and a p-channel transistor 42, where the amplified signals are applied to the gate electrodes of the p-channel transistor 41 and the p-channel transistor 42, and potential proportional to the amplified signals is supplied to the potential holding circuit 3. The squelch detecting circuit of this modification differs from the squelch detecting circuit of the preferred embodiment in that it uses the p-channel transistor 41 and the p-channel transistor 42 in place of the n-channel transistor 32 and the n-channel transistor 33. In the present invention, the p-channel transistors 41 and 42 are shown as an example and bipolar transistors may be used instead.

The potential holding circuit 3 includes the current source 34 and the capacitance 35, where the current source 34 and the capacitance 35 each have one terminal connected to the source electrodes of the p-channel transistor 41 and the p-channel transistor 42, and their other terminals are connected to power-supply. The comparator circuit 4 includes the operational amplifier 15, where the potential from the potential holding circuit 3 is supplied to the minus terminal of the operational amplifier 15 and the potential from the constant-voltage source 16, or the reference potential, is supplied to its plus terminal. As compared with the preferred embodiment, the inputs of the operational amplifier 15 are reversed because this modification uses the p-channel transistor 41 and the p-channel transistor 42 in place of the n-channel transistor 32 and the n-channel transistor 33.

Figure 9A:
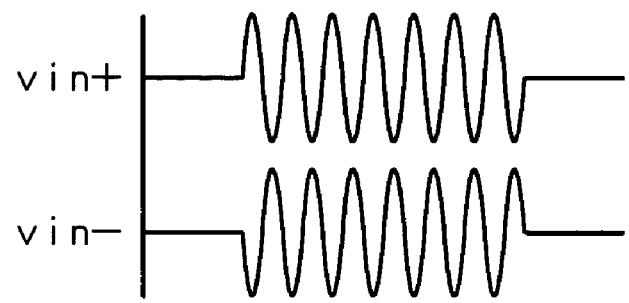
FIGS. 9A to 9D are diagrams showing the waveforms of signals in the squelch detecting circuit of the modification of the second preferred embodiment of the invention.
Figure 9B:
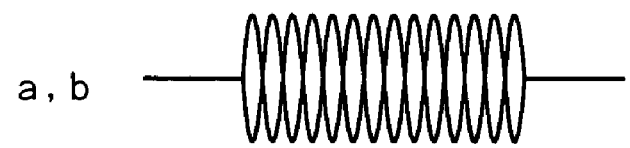
Figure 9C:
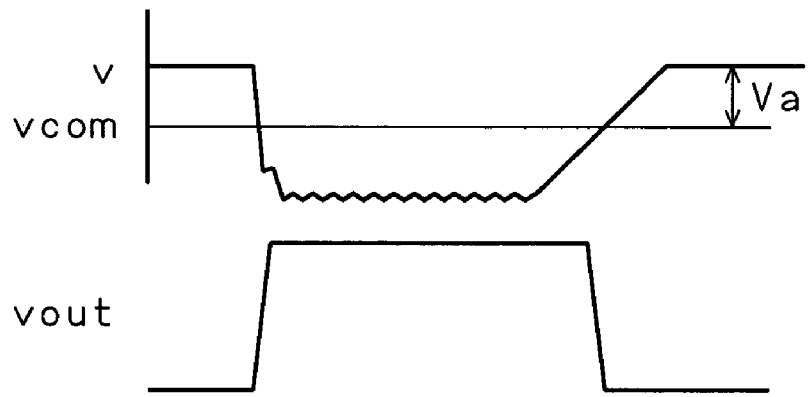

Next, the operation of the squelch detecting circuit of this modification is described. FIG. 9A shows the input differential signals vin+ and vin− inputted to the operational amplifier 31. The input differential signals vin+ and vin− are converted by the operational amplifier 31 to the differential amplified signals a and b. FIG. 9B shows the superimposed waveform of the differential amplified signals a and b. The differential amplified signals a and b are inputted to the gate electrodes of the p-channel transistor 41 and the p-channel transistor 42 and then the p-channel transistor 41 and the p-channel transistor 42 operate to supply the potential holding circuit 3 with potential proportional to the amplified signals a and b. The potential v of the source electrodes of the p-channel transistor 41 and the p-channel transistor 42 sharply falls as the amplified signals a and b fall. However, when the amplified signals a and b rise, since charge is supplied through the current source 34, and because of the presence of the capacitance 35, the potential v of the source electrodes of the p-channel transistor 41 and the p-channel transistor 42 is kept nearly constant. FIG. 9C shows the output potential v provided from the potential holding circuit 3 upon the input of the amplified signals.

The potential v held by the potential holding circuit 3 is inputted to the minus side of the operational amplifier 15. On the other hand, a comparison potential obtained by circuit simulation is inputted to the plus side of the operational amplifier 15. FIG. 9C also shows the waveform of the potential vcom of the constant-voltage source 16. The potential vcom is a fixed potential that differs by the voltage Va of the constant-voltage source 16 from the reference potential of the potential v held by the potential holding circuit 3.

Figure 9D:

The operational amplifier 15 compares the potential v held by the potential holding circuit 3 with the potential vcom of the constant-voltage source 16. Referring to FIG. 9C, the operational amplifier 15 indicates a High state when the potential v held by the potential holding circuit 3 is smaller than the potential vcom and indicates a Low state when it is larger than the potential vcom. Then the operational amplifier 15 outputs a rectangular-wave detect signal vout as shown in FIG. 9D.

As described so far, in the squelch detecting circuit of this modification, the differential amplification circuit 1 is formed of the operational amplifier 31 that amplifies differential input signals to output differential amplified signals, the gain proportion circuit 2 is formed of the p-channel transistor 41 that receives one of the differential amplified signals at its gate electrode and supplies a potential from its source electrode to the potential holding circuit 3 and the p-channel transistor 42 that receives the other differential amplified signal at its gate electrode and supplies a potential from its source electrode to the potential holding circuit 3, the potential holding circuit 3 is formed of the current source 34 having its one terminal connected to the source electrodes of the p-channel transistors 41 and 42 and the other terminal connected to the power-supply potential and the capacitance 35 having its one terminal connected to the source electrodes of the p-channel transistors 41 and 42 and to the current source 34 and having the other terminal connected to the power-supply potential, and the comparator circuit 4 is formed of the operational amplifier 15 that receives the potential held by the potential holding circuit 3 and the reference potential, so that, as in the preferred embodiment, the potential outputted from the potential holding circuit 3 exhibits an almost flat rectangular waveform by the rectification effect, which enables steadier operation of the squelch detecting circuit.

(Third Preferred Embodiment)

Figure 10:
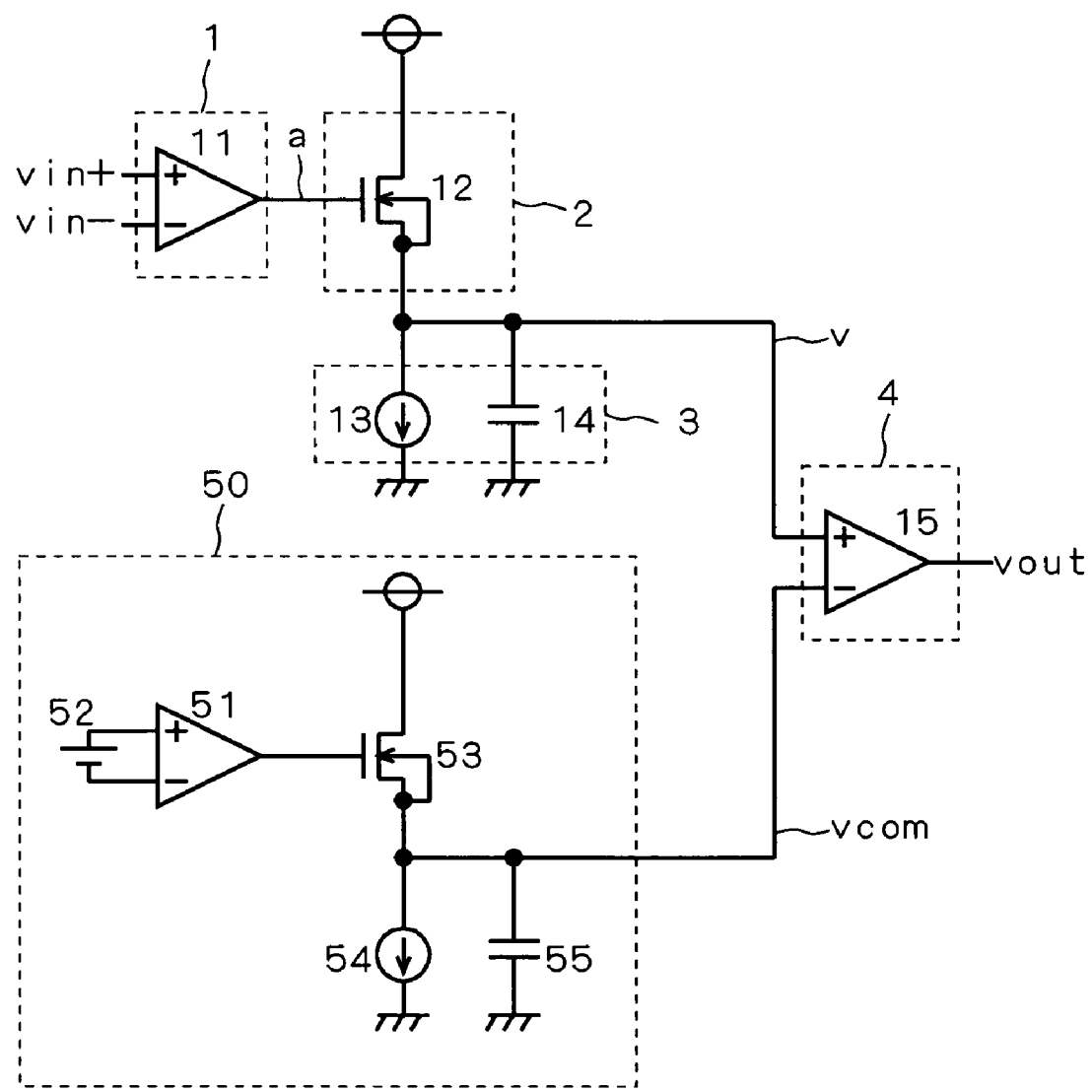
FIG. 10 is a circuit diagram of a squelch detecting circuit according to a third preferred embodiment of the invention.

The block diagram of FIG. 1 is applied also to the squelch detecting circuit of this preferred embodiment. This preferred embodiment uses a replica circuit in place of the constant-voltage source 16 of the first preferred embodiment. FIG. 10 is a circuit diagram of the squelch detecting circuit of this preferred embodiment. In FIG. 10, the differential amplification circuit 1 includes the operational amplifier 11, where the operational amplifier 11 amplifies the input differential signals to output a single-end amplified signal. The gain proportion circuit 2 includes the n-channel transistor 12, where the single-end amplified signal outputted from the operational amplifier 11 is applied to the gate electrode of the n-channel transistor 12. The n-channel transistor 12 supplies the potential holding circuit 3 with a potential proportional to the applied amplified signal.

The potential holding circuit 3 includes the current source 13 and the capacitance 14, where the current source 13 and the capacitance 14 each have one terminal connected to the source electrode of the n-channel transistor 12 and the other terminal connected to GND. The comparator circuit 4 includes the operational amplifier 15, where the potential from the potential holding circuit 3 is supplied to the plus terminal of the operational amplifier 15.

The potential inputted to the minus terminal of the operational amplifier 15 is not the potential of the constant-voltage source 16 of the first preferred embodiment but a potential generated by a replica circuit 50 that has the same configuration as the circuit connected to the plus terminal of the operational amplifier 15. The replica circuit 50 includes an operational amplifier 51 corresponding to the operational amplifier 11, with a constant-voltage source 52 connected to the operational amplifier 51. For example, this constant-voltage source 52 generates a voltage of 50 mV that conforms to the spec of the SerialATA. An n-channel transistor 53, corresponding to the n-channel transistor 12, receives at its gate electrode the output from the operational amplifier 51. The n-channel transistor 53 supplies a potential from its source electrode on the basis of the potential applied to its gate electrode.

The potential supplied from the source electrode of the n-channel transistor 53 is held by a current source 54 and a capacitance 55 corresponding to the current source 13 and the capacitance 14. The potential held by the current source 54 and the capacitance 55 is supplied as the reference potential to the minus terminal of the operational amplifier 15.

Next, the operation of the squelch detecting circuit of this preferred embodiment is described. FIG. 11A shows the input differential signals vin+ and vin− inputted to the operational amplifier 11. The input differential signals vin+ and vin− are amplified and converted by the operational amplifier 11 to the single-end amplified signal a. FIG. 11B shows the waveform of the amplified signal a outputted from the operational amplifier 11. This amplified signal a is inputted to the gate electrode of the n-channel transistor 12 and then the n-channel transistor 12 operates to supply the potential holding circuit 3 with a potential proportional to the amplified signal a. The potential v of the source electrode of the n-channel transistor 12 sharply rises as the amplified signal rises. However, when the amplified signal a falls, since the charge is released through the current source 13, the potential v of the source electrode of the n-channel transistor 12 falls at a certain rate, lagging behind the amplified signal.

Also, since the potential holding circuit 3 includes the capacitance 14, the source electrode potential v of the transistor 12 is held for a certain period. FIG. 11C shows the output potential v provided from the potential holding circuit 3 upon the input of the amplified signal a. In FIG. 11C, as the amplified signal a rises, the potential v of the source electrode of the n-channel transistor 12 sharply rises and it is then held.

The potential v held by the potential holding circuit 3 is inputted to the plus side of the operational amplifier 15. The output potential from the replica circuit 50 is inputted to the minus side of the operational amplifier 15. FIG. 11C also shows the waveform of the output potential vcom from the replica circuit 50. The potential vcom is a fixed potential that differs by a certain voltage from the reference potential of the potential v held by the potential holding circuit 3.

The operational amplifier 15 compares the potential v held by the potential holding circuit 3 with the output potential vcom from the replica circuit 50. Referring to FIG. 11C, the operational amplifier 15 indicates a High state when the potential v held by the potential holding circuit 3 is larger than the potential vcom and indicates a Low state when it is smaller than the potential vcom. Then the operational amplifier 15 outputs a rectangular-wave detect signal vout as shown in FIG. 11D.

As described above, the squelch detecting circuit of this preferred embodiment further includes the replica circuit 50 which has the same circuit configuration as the differential amplification circuit 1, the gain proportion circuit 2 and the potential holding circuit 3, and to which a certain voltage is applied in place of the differential input signals, and the comparator circuit 4 receives the output potential from the replica circuit 50 in place of the reference potential. Thus, the reference potential is generated not by a different circuit configuration but by the replica circuit 50 having nearly the same circuit configuration, which enhances the accuracy of the reference potential and further improves the steadiness of the operation of the squelch detecting circuit. However, the circuit occupies almost a doubled area and hence consumes almost doubled power.

(First Modification)

Figure 12:
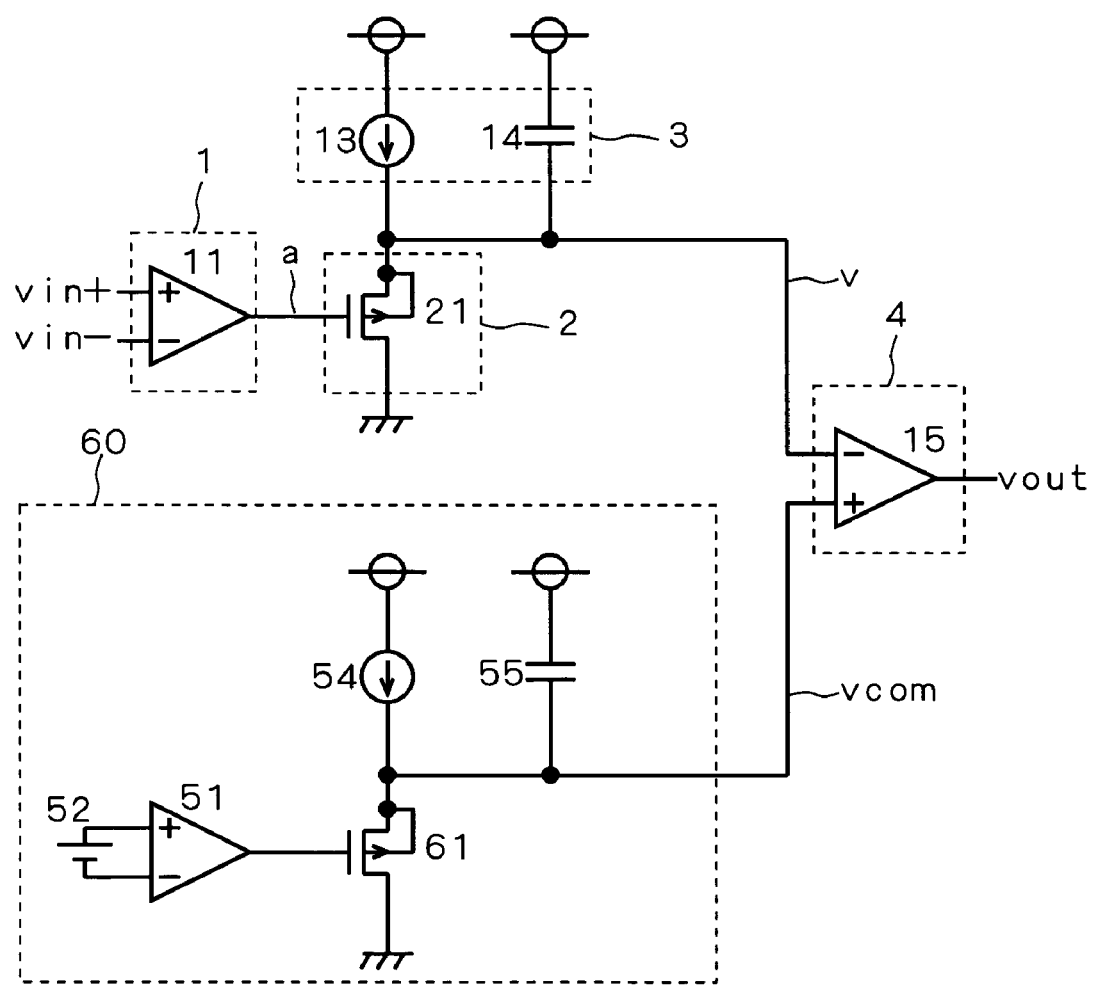
FIG. 12 is a circuit diagram of a squelch detecting circuit according to a modification of the third preferred embodiment of the invention.

FIG. 12 is a circuit diagram of the squelch detecting circuit according to a first modification of this preferred embodiment. This modification uses a replica circuit 60 in place of the constant-voltage source 16 of the modification of the first preferred embodiment. In FIG. 12, the operational amplifier 11 amplifies the input differential signals to output a single-end amplified signal. The single-end amplified signal outputted from the operational amplifier 11 is applied to the gate electrode of the p-channel transistor 21. The p-channel transistor 21 supplies to the current source 13 and capacitance 14 a potential proportional to the applied amplified signal. The current source 13 and the capacitance 14 each have one terminal connected to the source electrode of the p-channel transistor 21 and the other terminal connected to power-supply. The potential held by the current source 13 and the capacitance 14 is supplied to the minus terminal of the operational amplifier 15.

The potential inputted to the plus terminal of the operational amplifier 15 is a potential generated by the replica circuit 60 that has the same configuration as the circuit connected to the minus terminal of the operational amplifier 15. The replica circuit 60 includes the operational amplifier 51 corresponding to the operational amplifier 11, with the constant-voltage source 52 connected to the operational amplifier 51. A p-channel transistor 61, corresponding to the p-channel transistor 21, receives at its gate electrode the output from the operational amplifier 51. The p-channel transistor 61 supplies a potential from its source electrode on the basis of the potential applied to its gate electrode. The potential supplied from the source electrode of the p-channel transistor 61 is held by the current source 54 and the capacitance 55 corresponding to the current source 13 and the capacitance 14. The potential held by the current source 54 and the capacitance 55 is supplied as the reference potential to the plus terminal of the operational amplifier 15.

The operation of the squelch detecting circuit of the first modification of this preferred embodiment is described. FIG. 13A shows the single-end amplified signal a outputted from the operational amplifier 11. FIG. 13B shows the signal v inputted to the operational amplifier 15. FIG. 13C shows the detect signal vout outputted from the operational amplifier 15. These signal waveforms are basically the same as those of the modification of the first preferred embodiment, and the operation of the squelch detecting circuit of this modification is the same as that of the modification of the first preferred embodiment except that the reference potential accuracy is enhanced. Therefore the operation of the squelch detecting circuit of this modification is not described in detail here.

(Second Modification)

FIG. 14 is a circuit diagram of the squelch detecting circuit according to a second modification. This modification uses a replica circuit 70 in place of the constant-voltage source 16 of the second preferred embodiment. In FIG. 14, the operational amplifier 31 amplifies the input differential signals to output differential amplified signals. One of the differential amplified signals that is outputted from the minus side of the operational amplifier 31 is applied to the gate electrode of the n-channel transistor 32. The other differential amplified signal outputted from the plus side of the operational amplifier 31 is applied to the gate electrode of the n-channel transistor 33. The n-channel transistor 32 and the n-channel transistor 33 supply the current source 34 and capacitance 35 with potential proportional to the applied amplified signals. The current source 34 and the capacitance 35 each have one terminal connected to the source electrodes of the n-channel transistor 32 and the n-channel transistor 33 and the other terminal connected to GND. The potential held by the current source 34 and the capacitance 35 is supplied to the plus terminal of the operational amplifier 15.

The potential inputted to the minus terminal of the operational amplifier 15 is a potential generated by the replica circuit 70 that has the same configuration as the circuit connected to the plus terminal of the operational amplifier 15. The replica circuit 70 includes an operational amplifier 71 corresponding to the operational amplifier 31, with a constant-voltage source 72 connected to the operational amplifier 71. An n-channel transistor 73 and an n-channel transistor 74, corresponding to the n-channel transistor 32 and n-channel transistor 33, receive at their gate electrodes the outputs from the operational amplifier 71. The n-channel transistor 73 and the n-channel transistor 74 supply potential from their source electrodes on the basis of the potentials applied to their gate electrodes. The potential supplied from the source electrodes of the n-channel transistor 73 and the n-channel transistor 74 is held by a current source 75 and a capacitance 76 corresponding to the current source 34 and the capacitance 35. The potential held by the current source 75 and the capacitance 76 is supplied as the reference potential to the minus terminal of the operational amplifier 15.

The operation of the squelch detecting circuit of the second modification is described. FIG. 15A shows the differential amplified signals a and b outputted from the operational amplifier 31. FIG. 15B shows the signal v inputted to the operational amplifier 15. FIG. 15C shows the detect signal vout outputted from the operational amplifier 15. These signal waveforms are basically the same as those of the second preferred embodiment, and the operation of the squelch detecting circuit of this modification is the same as that of the second preferred embodiment except that the reference potential accuracy is enhanced. Therefore the operation of the squelch detecting circuit of this modification is not described in detail here.

(Third Modification)

FIG. 16 is a circuit diagram of the squelch detecting circuit according to a third modification. This modification uses a replica circuit 80 in place of the constant-voltage source 16 of the modification of the second preferred embodiment. In FIG. 16, the operational amplifier 31 amplifies the input differential signals to output differential amplified signals. One of the differential amplified signals that is outputted from the plus side of the operational amplifier 31 is applied to the gate electrode of the p-channel transistor 41. The other differential amplified signal outputted from the minus side of the operational amplifier 31 is applied to the gate electrode of the p-channel transistor 42. The p-channel transistor 41 and the p-channel transistor 42 supply the current source 34 and capacitance 35 with potential proportional to the applied amplified signals. The current source 34 and the capacitance 35 each have one terminal connected to the source electrodes of the p-channel transistor 41 and the p-channel transistor 42 and the other terminal connected to power-supply. The potential held by the current source 34 and the capacitance 35 is supplied to the minus terminal of the operational amplifier 15.

The potential inputted to the plus terminal of the operational amplifier 15 is a potential generated by the replica circuit 80 that has the same configuration as the circuit connected to the minus terminal of the operational amplifier 15. The replica circuit 80 includes the operational amplifier 71 corresponding to the operational amplifier 31, with the constant-voltage source 72 connected to the operational amplifier 71. A p-channel transistor 81 and a p-channel transistor 82, corresponding to the p-channel transistor 41 and the p-channel transistor 42, receive at their gate electrodes the outputs from the operational amplifier 71. The p-channel transistor 81 and the p-channel transistor 82 supply potential from their source electrodes on the basis of the potentials applied to their gate electrodes. The potential supplied from the source electrodes of the p-channel transistor 81 and the p-channel transistor 82 is held by the current source 75 and the capacitance 76 corresponding to the current source 34 and the capacitance 35. The potential held by the current source 75 and the capacitance 76 is supplied as the reference potential to the plus terminal of the operational amplifier 15.

The operation of the squelch detecting circuit of the third modification is described. FIG. 17A shows the differential amplified signals a and b outputted from the operational amplifier 31. FIG. 17B shows the signal v inputted to the operational amplifier 15. FIG. 17C shows the detect signal vout outputted from the operational amplifier 15. These signal waveforms are basically the same as those of the modification of the second preferred embodiment, and the operation of the squelch detecting circuit of this modification is the same as that of the modification of the second preferred embodiment except that the reference potential accuracy is enhanced. Therefore the operation of the squelch detecting circuit of this modification is not described in detail here.

In the present invention, the n-channel transistors 12, 32, 33, 53, 73 and 74 and the p-channel transistors 21, 41, 42, 61, 81 and 82 are meant to be only illustrative and bipolar transistors may be used instead.

While the invention has been described in detail, the foregoing description is in all aspects illustrative and not restrictive. It is understood that numerous other modifications and variations can be devised without departing from the scope of the invention.

What is claimed is:

1. A squelch detecting circuit comprising:
   a differential amplification circuit that amplifies differential input signals to output an amplified signal;
   a gain proportion circuit that supplies a potential proportional to said amplified signal;
   a potential holding circuit that holds said potential supplied from said gain proportion circuit; and
   a comparator circuit that compares said potential held by said potential holding circuit and a reference potential to output a detect signal, wherein
   said differential amplification circuit comprises a first operational amplifier that amplifies said differential input signals to output a single-end amplified signal,
   said gain proportion circuit comprises an n-type transistor that receives said single-end amplified signal at its control electrode and supplies a potential from its first current electrode to said potential holding circuit,
   said potential holding circuit comprises a first current source having its one terminal connected to said first current electrode of said n-type transistor and the other terminal connected to GND, and a first capacitance having its one terminal connected to said first current electrode of said n-type transistor and to said first current source and having the other terminal connected to GND, and
   said comparator circuit comprises a second operational amplifier that receives said potential held by said potential holding circuit and said reference potential.

2. The squelch detecting circuit according to claim 1, further comprising a replica circuit having a same circuit configuration as said differential amplification circuit, said gain proportion circuit, and said potential holding circuit and receiving a given voltage in place of said differential input signals, wherein said comparator circuit receives an output potential from said replica circuit in place of said reference potential.

3. A squelch detecting circuit comprising:
   a differential amplification circuit that amplifies differential input signals to output an amplified signal;
   a gain proportion circuit that supplies a potential proportional to said amplified signal;
   a potential holding circuit that holds said potential supplied from said gain proportion circuit; and
   a comparator circuit that compares said potential held by said potential holding circuit and a reference potential to output a detect signal, wherein
   said differential amplification circuit comprises a first operational amplifier that amplifiers said differential input signals to output a single-end amplified signal;
   said gain proportion circuit comprises a p-type transistor that receives said single-end amplified signal at its control electrode and supplies a potential from its first current electrode to said potential holding circuit,
   said potential holding circuit comprises a first current source having its one terminal connected to said first current electrode of said p-type transistor and the other terminal connected to a power-supply potential, and a first capacitance having its one terminal connected to said first current electrode of said p-type transistor and to said first current source and having the other terminal connected to the power-supply potential, and
   said comparator circuit comprises a second operational amplifier that receives said potential held by said potential holding circuit and said reference potential.

4. The squelch detecting circuit according to claim 3, further comprising a replica circuit having a same circuit configuration as said differential amplification circuit, said gain proportion circuit, and said potential holding circuit and receiving a given voltage in place of said differential input signals, wherein said comparator circuit receives an output potential from said replica circuit in place of said reference potential.

5. A squelch detecting circuit comprising:
   a differential amplification circuit that amplifies differential input sianals to output an amplified signal;
   a gain proportion circuit that supplies a potential proportional to said amplified signal;
   a potential holding circuit that holds said potential supplied from said gain proportion circuit; and
   a comparator circuit that compares said potential held by said potential holding circuit and a reference potential to output a detect signal, wherein
   said differential amplification circuit comprises a third operational amplifier that amplifiers said differential input signals to output said amplified signal comprising differential amplified signals;
   said gain proportion circuit comprises a first n-type transistor that receives one of said differential amplified signals at its control electrode and supplies a potential from its first current electrode to said potential holding circuit, and a second n-type transistor that receives the other of said differential amplified signals at its control electrode and supplies a potential from its first current electrode to said potential holding circuit, said potential holding circuit comprises a first current source having its one terminal connected to said first current electrodes of said first and second n-type transistors and the other terminal connected to GND, and a first capacitance having its one terminal connected to said first current electrodes of said first and second n-type transistors and to said first current source and having the other terminal connected to GND, and said comparator circuit comprises a fourth operational amplifier that receives said potential held by said potential holding circuit and said reference potential.

6. The squelch detecting circuit according to claim 5, further comprising a replica circuit having a same circuit configuration as said differential amplification circuit, said gain proportion circuit, and said potential holding circuit and receiving a given voltage in place of said differential input signals, wherein said comparator circuit receives an output potential from said replica circuit in place of said reference potential.

7. A squelch detecting circuit comprising:

a differential amplification circuit that amplifies differential input signals to output an amplified signal;

a gain proportion circuit that supplies a potential proportional to said amplified signal;

a potential holding circuit that holds said potential supplied from said gain proportion circuit; and a comparator circuit that compares said potential held by said potential holding circuit and a reference potential to output a detect signal, wherein said differential amplification circuit comprises a third operational amplifier that amplifiers said differential input signals to output said amplified signal comprising differential amplified signals;

said gain proportion circuit comprises a first p-type transistor that receives one of said differential amplified signals at its control electrode and supplies a potential from its first current electrode to said potential holding circuit, and a second p-type transistor that receives the other of said differential amplified signals at its control electrode and supplies a potential from its first current electrode to said potential holding circuit, said potential holding circuit comprises a first current source having its one terminal connected to said first current electrodes of said first and second p-type transistors and the other terminal connected to a power-supply potential, and a first capacitance having its one terminal connected to said first current electrodes of said first and second p-type transistors and to said first current source and having the other terminal connected to the power-supply potential, and said comparator circuit comprises a fourth operational amplifier that receives said potential held by said potential holding circuit and said reference potential.

8. The squelch detecting circuit according to claim 7, further comprising a replica circuit having a same circuit configuration as said differential amplification circuit, said gain proportion circuit, and said potential holding circuit and receiving a given voltage in place of said differential input signals, wherein said comparator circuit receives an output potential from said replica circuit in place of said reference potential.

9. A squelch detecting circuit comprising:

a differential amplification circuit that amplifies differential input signals to output an amplified signal, a gain proportion circuit that supplies a potential proportional to said amplified signal;

a potential holding circuit that holds said potential supplied from said gain proportion circuit;

a comparator circuit that compares said potential held by said potential holding circuit and a reference potential to output a detect signal; and a replica circuit having a same circuit configuration as said differential amplification circuit, said gain proportion circuit, and said potential holding circuit and receiving a given voltage in place of said differential input signals, wherein said comparator circuit receives an output potential from said replica circuit in place of said reference potential.

* * * * *